United States Patent
Kim et al.

(10) Patent No.: US 8,873,674 B2
(45) Date of Patent: Oct. 28, 2014

(54) SYSTEM AND METHOD FOR INCREASING BANDWIDTH FOR DIGITAL PREDISTORTION IN MULTI-CHANNEL WIDEBAND COMMUNICATION SYSTEMS

(71) Applicant: Dali Systems Co. Ltd., George Town (KY)

(72) Inventors: Wan-Jong Kim, Coquitlam (CA); Shawn Patrick Stapleton, Burnaby (CA)

(73) Assignee: Dali Systems Co. Ltd., George Town Grand Cayman (KY)

( * ) Notice: Subject to any disclaimer, the term of this patent is extended or adjusted under 35 U.S.C. 154(b) by 22 days.

(21) Appl. No.: 13/625,760

(22) Filed: Sep. 24, 2012

(65) Prior Publication Data
US 2013/0077713 A1    Mar. 28, 2013

Related U.S. Application Data

(60) Provisional application No. 61/538,042, filed on Sep. 22, 2011.

(51) Int. Cl.
| | | |
|---|---|---|
| H04L 25/03 | (2006.01) | |
| H03F 1/32 | (2006.01) | |
| H04L 27/36 | (2006.01) | |
| H04B 1/04 | (2006.01) | |

(52) U.S. Cl.
CPC ...... H03F 1/3247 (2013.01); *H04B 2001/0425* (2013.01); *H04B 1/0475* (2013.01); *H04L 27/368* (2013.01)
USPC ........ 375/296; 375/297; 455/63.1; 455/114.3

(58) Field of Classification Search
CPC .............. H03F 1/3247; H03F 2201/32; H03F 2201/32221; H03F 2201/3227; H03F 2201/3231; H03F 2201/3233; H03F 1/32; H04L 27/366–27/368; H04L 1/0033; H03G 3/3042; H04B 2001/02; H04B 2001/0408; H04B 2001/0425
USPC .............. 375/285, 295–297; 455/63.1, 67.11, 455/67.13, 91, 114.2, 114.3, 115
See application file for complete search history.

(56) References Cited

U.S. PATENT DOCUMENTS

| | | | |
|---|---|---|---|
| 7,983,327 B2 * | 7/2011 | Brobston | 375/219 |
| 8,005,162 B2 | 8/2011 | Cai et al. | |
| 8,576,943 B2 * | 11/2013 | Kilambi et al. | 375/296 |

(Continued)

FOREIGN PATENT DOCUMENTS

WO    WO 2013/044238    3/2013

OTHER PUBLICATIONS

Notification of Transmittal of the International Search Report and the Written Opinion of the International Searching Authority, or the Declaration; International Search Report and Written Opinion of the International Searching Authority for corresponding International application No. PCT/US2012/052918 mailed on Dec. 24, 2012, 8 pages.

*Primary Examiner* — Dac Ha
(74) *Attorney, Agent, or Firm* — Kilpatrick Townsend & Stockton LLP

(57) ABSTRACT

A digital predistortion linearization method is provided for increasing the instantaneous or operational bandwidth for RF power amplifiers employed in wideband communication systems. Embodiments of the present invention provide a method of increasing DPD linearization bandwidth using a feedback filter integrated into existing digital platforms for multi-channel wideband wireless transmitters. An embodiment of the present invention utilizes a DPD feedback signal in conjunction with a low power band-pass filter in the DPD feedback path.

24 Claims, 10 Drawing Sheets

(56) References Cited

U.S. PATENT DOCUMENTS

| | | | |
|---|---|---|---|
| 2005/0180526 A1* | 8/2005 | Kim et al. | 375/297 |
| 2009/0232507 A1 | 9/2009 | Gupta et al. | |
| 2009/0238206 A1 | 9/2009 | Hamada et al. | |
| 2009/0256630 A1* | 10/2009 | Brobston | 330/2 |
| 2010/0159856 A1* | 6/2010 | Kato et al. | 455/114.3 |
| 2010/0308910 A1 | 12/2010 | Barnes | |

* cited by examiner

SYSTEM AND METHOD FOR INCREASING BANDWIDTH FOR DIGITAL PREDISTORTION IN MULTI-CHANNEL WIDEBAND COMMUNICATION SYSTEMS

CROSS-REFERENCES TO RELATED APPLICATIONS

This application claims priority to U.S. Provisional Patent Application No. 61/538,042, filed on Sep. 22, 2011, titled "System and Method for Increasing Bandwidth for Digital Predistortion in Multi-Channel Wideband Communication Systems," the disclosure of which is hereby incorporated by reference in its entirety for all purposes.

BACKGROUND OF THE INVENTION

The present invention generally relates to wideband communication systems using multiplexing modulation techniques. More specifically, the present invention relates to a method of increasing instantaneous or operational bandwidth for digital predistortion linearization in order to compensate for nonlinearities and/or memory effects in multi-channel wideband wireless transmitters.

The linearity and efficiency of radio frequency (RF) power amplifiers (PAs) have become critical design issues for non-constant envelope digital modulation schemes with high peak-to-average power ratio (PAR) values. This has happened as a result of the increased importance of spectral efficiency in wireless communication systems. RF PAs have nonlinearities which generate amplitude modulation-amplitude modulation (AM-AM) distortion and amplitude modulation-phase modulation (AM-PM) distortion at the output of the PA. These undesired effects may create spectral regrowth in the adjacent channels, as well as in-band distortion which may degrade the error vector magnitude (EVM). Commercial wireless communication systems may for example employ a bandwidth in the range of 20 MHz to 25 MHz. In such an example, these spectral regrowth effects create an undesired impact over a frequency band which is more than 100 MHz to 125 MHz wide. The potential impacts may include inter-system and intra-system interference. Therefore, there is a need in the art for improved methods and systems related to communications systems.

SUMMARY OF THE INVENTION

It is advisable to employ a linearization technique in RF PA applications in order to eliminate or reduce spectral regrowth and in-band distortion effects. Various RF PA linearization techniques have been proposed in the literature such as feedback, feedforward and predistortion. One of the most promising linearization techniques is baseband digital predistortion (DPD), which takes advantage of recent advances in digital signal processors. DPD can achieve better linearity and higher power efficiency with a reduced system complexity when compared to the widely-used conventional feedforward linearization technique. Moreover, a software implementation provides the digital predistorter with a re-configurability feature which is desirable for multi-standards environments. In addition, a PA using an efficiency enhancement technique such as a Doherty power amplifier (DPA) is able to achieve higher efficiencies than traditional PA designs, at the expense of linearity. Therefore, combining DPD with a DPA using an efficiency enhancement technique has the potential for maximizing system linearity and overall efficiency.

Requirements for instantaneous bandwidth (for example, exceeding 25 MHz) for next generation wireless systems continue to increase, which means that the DPD processing speed needs to be increased accordingly. This higher processing speed may result in new digital platform design efforts, which can often take several months and significant staff resources and costs to complete. The higher processing speed can also result in higher system costs and increased power consumption due to sampling rate increases for DPD in Field Programmable Gate Arrays (FPGAs), digital-to-analog converters (DACs), and analog-to-digital converters (ADCs). In addition, RF/IF filter requirements are more stringent, which will also likely increase system costs and complexity. Another typical result of having DPD with a wider instantaneous bandwidth may be increased memory effects. This may cause the DPD algorithm to become much more complex and will take longer to design, optimize and test.

Embodiments of the present invention provide DPD linearization methods and systems that provide wider bandwidth without adding a high degree of complexity and cost.

Accordingly, embodiments of the present invention overcome the limitations previously discussed. Embodiments of the present invention provide a method of increasing DPD linearization bandwidth without costly modifications to an existing digital platform for multi-channel wideband wireless transmitters. To achieve the above objects, according to some embodiments of the present invention, a DPD feedback signal is employed along with a narrow band-pass filter in the DPD feedback path. The embodiments described herein are able to extend the DPD bandwidth obtainable with an existing digital transmitter system, without changes in digital signal processing components, which could result in increased power consumption and/or cost.

Numerous benefits are achieved by way of the present invention over conventional techniques. As described more fully herein, the digital finite impulse response (FIR) filter characteristic for DPD output is important in order to avoid the overlapping of distortions, which can cause errors in an indirect learning algorithm based on DPD output and feedback input. This can result in the need to utilize digital FIR filters with a large number of taps. Embodiments of the present invention may provide for the removal of the digital FIR filter by using a direct learning algorithm based on DPD input and feedback input. Accordingly, embodiments of the present invention may decrease the number of multipliers for multiband applications and even for single band applications. Moreover, an analog filter characteristic in the analog feedback path may also be provided in order to avoid the overlapping of distortions, which can cause errors in the calculation of coefficients. Thus, embodiments of the present invention reduce or eliminate the need for one or more multi-pole ceramic filters, which are big and expensive, replacing them with one or more less-stringent ceramic filters that only removes aliasing in the feedback ADC. Accordingly, the digital FIR filter with a large number of taps can be inserted in order to avoid the overlapping. Furthermore, one filter can be shared for multiband applications. Consequently, embodiments of the present invention can utilize a normal ceramic filter and one sharp digital filter with a large number of taps. These and other embodiments of the invention along with many of its advantages and features are described in more detail in conjunction with the text below and attached figures.

BRIEF DESCRIPTION OF THE DRAWINGS

Further objects and advantages of the invention can be more fully understood from the following detailed description taken in conjunction with the accompanying drawings in which.

DETAILED DESCRIPTION OF THE INVENTION

In general, the DPD techniques of the present invention can effectively improve the adjacent channel power ratio (ACPR). However, DPD performance suffers from the limited bandwidth associated with the speed limitation of the ADC employed in the DPD feedback path. This ADC is critical to processing the DPD feedback signals. Although modifying a product design to employ an ADC with a higher sampling rate would likely lead to enhanced DPD performance, that approach would increase the complexity and cost of the DPD function and would therefore result in higher system cost. This is obviously an undesirable approach for meeting new and evolving system requirements. In order to overcome these limitations, the present invention utilizes the bandpass characteristic of the duplexer associated with frequency division duplex wireless systems, so that the DPD is only required to provide distortion reduction over the reduced bandwidth of the PA output signals. The system provided by the present invention is therefore referred to as an enhanced-bandwidth digital predistortion (EBWDPD) system hereafter. Embodiments of the EBWDPD system are illustrated with respect to the accompanying drawings.

In conventional systems, the bandwidth associated with the DPD system is typically required to be five times the bandwidth of the input signal. For example, for a conventional system with a 20 MHz input signal bandwidth, the DPD function requires at least 100 MHz bandwidth for the DPD output and DPD feedback input, which means that feedback ADC sampling rate should be at least 200 Msps. This is a critical factor for a conventional DPD implementation.

Figure 2:
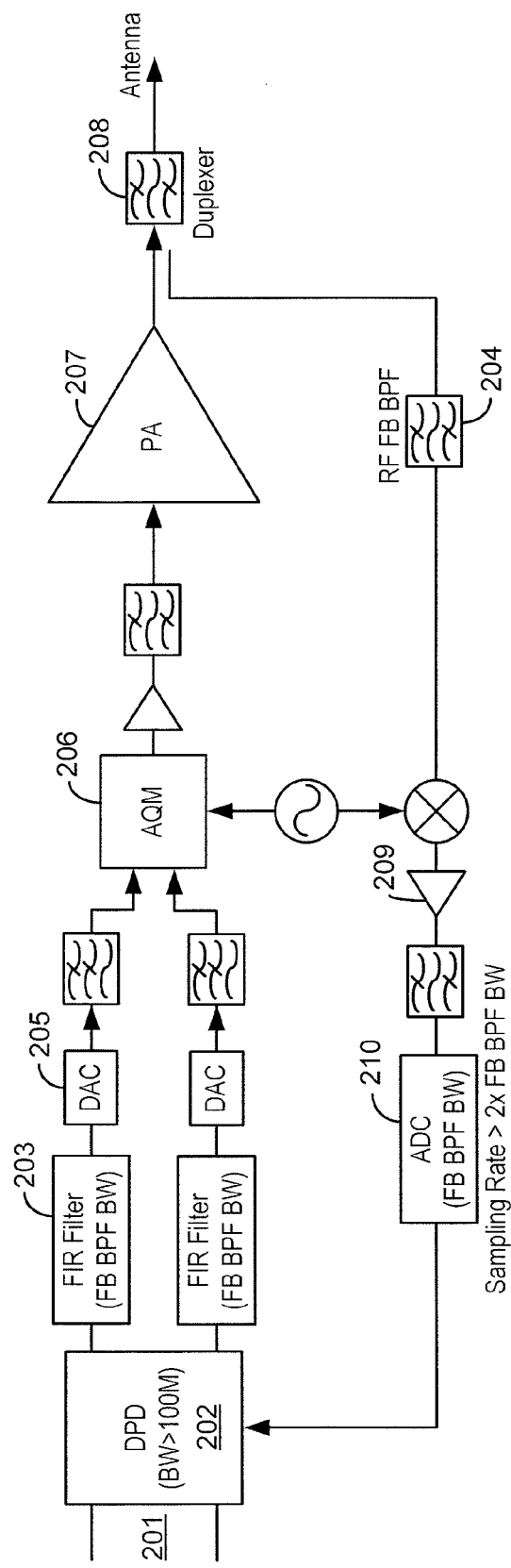
FIG. 2 is a schematic block diagram illustrating a multi-carrier wideband power amplifier system according to an embodiment of the present invention.

FIG. 2 is a schematic block diagram illustrating a multi-carrier wideband power amplifier system according to an embodiment of the present invention. The system illustrated in FIG. 2 comprises digital complex input samples 201 (with bandwidth of 20 MHz), digital predistortion circuits 202 (with bandwidth exceeding 100 MHz), a digital filter 203 with a similar bandwidth to that of the feedback band-pass filter 204 (FB BPF), digital-to-analog converters 205, an IQ modulator shown as AQM 206, a power amplifier 207, a duplexer 208 (with bandwidth of 20 MHz), radio frequency down-conversion circuits 209 with a low power feedback RF band-pass filter 204 (RF FB BPF) for the output coupled at the output of the PA 210, and an analog-to-digital converter 210 (with a bandwidth typically greater than the RF FB BPF bandwidth obtained by employing a sampling rate greater than two times the FB BPF bandwidth value) for the DPD feedback path. The RF FB BPF 204 filters the feedback signal to provide a signal characterized by a reduced bandwidth in comparison with the output of the power amplifier. DPD coefficients are extracted from the feedback signal produced by the RF FB BPF 204, which has a reduced bandwidth associated with the filter 204.

The DPD 202 introduces distortion components associated with the 3rd order and 5th order expansion of the input signal, which causes the DPD output bandwidth to be larger than approximately 100 MHz based on a 20 MHz input signal. In order to avoid instability of the DPD algorithm due to inaccurate error calculation from the DPD output (with bandwidth exceeding 100 MHz) and feedback signal (with FB BPF bandwidth), the DPD output is filtered by a digital filter 203 having a bandwidth value similar to that of the RF FB BPF 204. Embodiments of the present invention utilize an RF FB BPF 204 with a suitable bandwidth value as described more fully in relation to FIGS. 7A-7C. The bandwidth of filter 204 is less than the DPD bandwidth, which contrasts with conventional systems in which filter 204 would have a bandwidth equal to the DPD bandwidth. Additionally, the ADC 210 has a bandwidth associated with the FIR filter 203 in some embodiments, which is less than the DPD bandwidth.

It should be noted that in comparison with conventional systems, the bandwidth of various components in the multi-carrier wideband power amplifier system illustrated in FIG. 2 are reduced, thereby reducing system complexity and cost. As an example, the digital filter 203 has a bandwidth similar to that of the feedback band-pass filter 204 rather than exceeding 100 MHz based on the bandwidth of the digital predistortion circuits. The ADC 210 has a bandwidth typically greater than the RF FB BPF bandwidth obtained by employing a sampling rate greater than two times the FB BPF bandwidth value. Thus, embodiments of the present invention utilize components that operate at lower bandwidths and sampling rates than conventional components in a conventional system, reducing the system cost and complexity.

Figure 3:
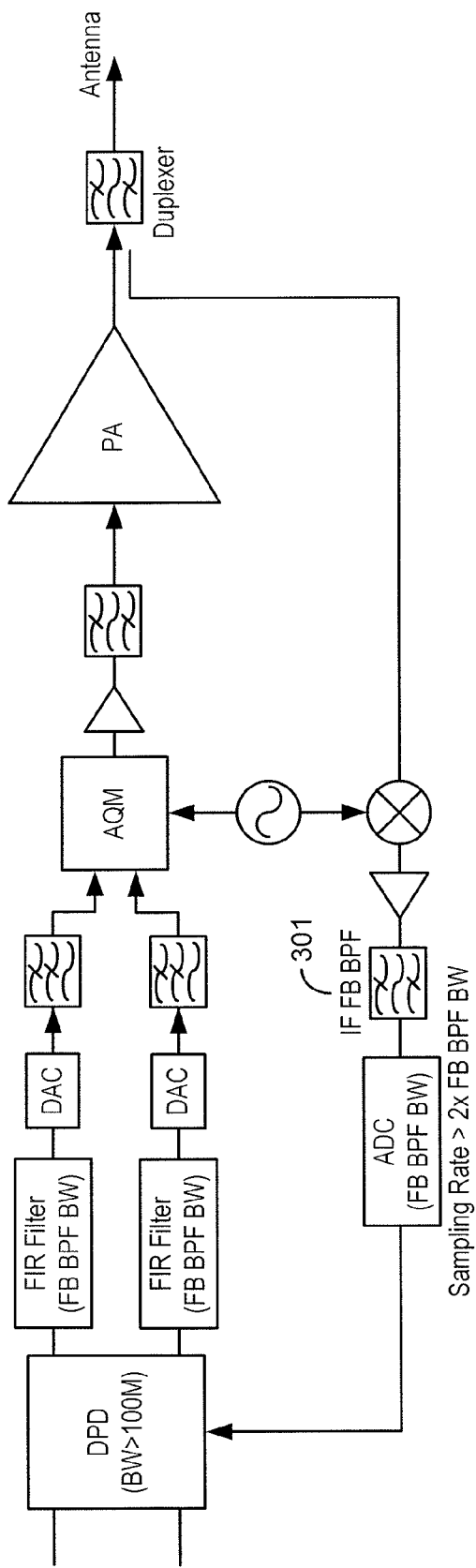
FIG. 3 is a schematic block diagram illustrating a multi-carrier wideband power amplifier system according to another embodiment of the present invention.

FIG. 3 is a schematic block diagram illustrating a multi-carrier wideband power amplifier system according to another embodiment of the present invention. This embodiment shares some common features with the system illustrated in FIG. 2 as well as some differences. As illustrated in FIG. 3, the system includes a low power narrowband IF band-pass filter 301. Embodiments of the present invention provided by the system illustrated in FIG. 3 may be easier and less costly to design and implement using an IF BPF filter compared to using an RF band-pass filter. With an IF filter, the present invention is applicable to systems employed with various applications based on the use of a common IF frequency. As was the case for the embodiment shown in FIG. 2, the feedback ADC following the IF FB BPF employs a sampling rate greater than two times the FB BPF bandwidth value for the DPD feedback path. This helps reduce the implementation cost while providing high performance. The feedback loop provides inputs (e.g., a measure of distortion in the power amplifier 207) that are used to introduce distortion that compensates for the amplifier distortion.

The embodiments shown in FIGS. 2 and 3 may employ a digital filter 203 characterized by a bandwidth that is less than the bandwidth (e.g., >100 MHz) used in conventional systems. Additionally, the embodiments shown in FIGS. 2 and 3 may include either a low power feedback IF BPF or an RF BPF coupled to the PA output. Thus, filtering can be performed at RF or IF according to various embodiments of the present invention.

Figure 4A:
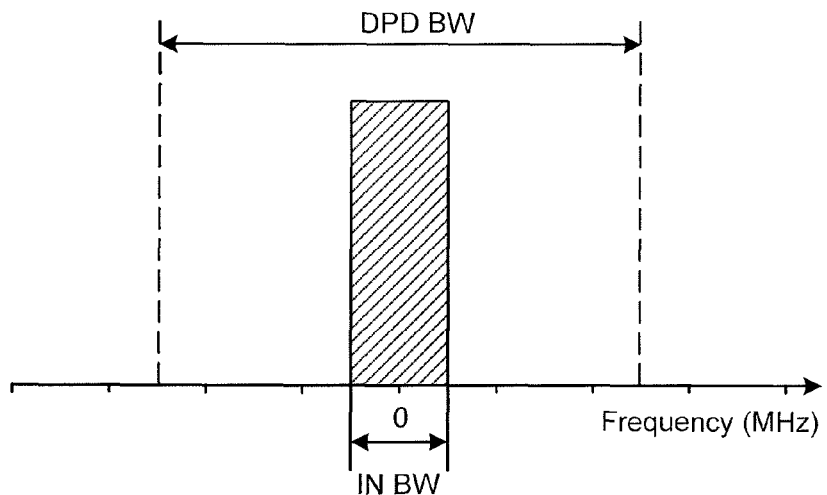
FIGS. 4A-4D are graphs showing the DPD bandwidth characteristics for a conventional system.
Figure 4B:
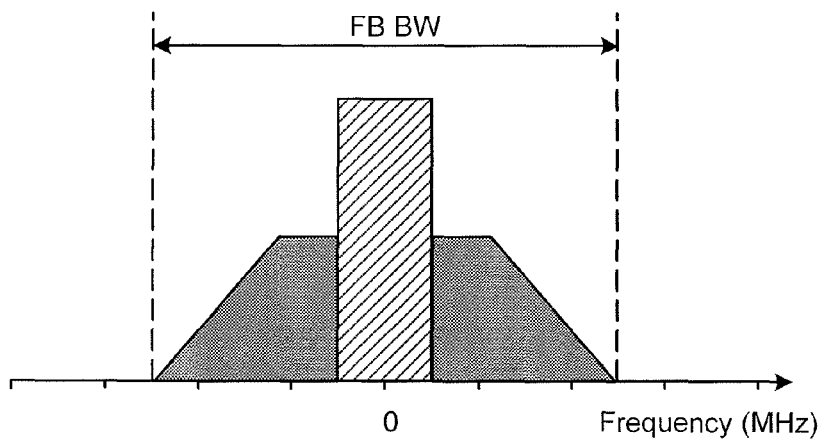
Figure 4C:
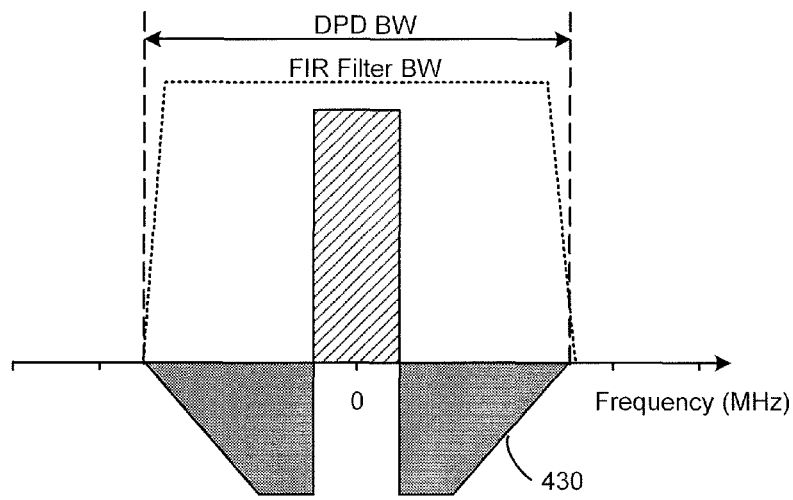
Figure 4D:
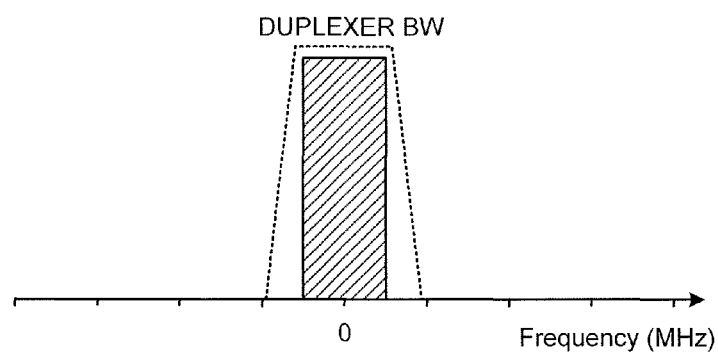

FIGS. 4A-4D are graphs showing the DPD bandwidth characteristics for a conventional system. The DPD bandwidth for conventional systems is required to be greater than 5 times the value of the input signal bandwidth. FIG. 4A shows the DPD input signal. FIG. 4B shows the feedback signal, with distortion components (dark shading) over a fairly wide bandwidth of FB BW. FIG. 4C shows the DPD output signal with predistortion components (based on the feedback signal) along with the FIR digital filter bandpass characteristic. The signal with predistortion components has a bandwidth of slightly less than the DPD bandwidth. FIG. 4D shows the PA/duplexer output signal with distortion having been canceled. The data is included in the central spectral band and distortion is illustrated in FIG. 4B and a distortion component with a 180 degrees phase shift (out of phase) is illustrated in FIG. 4C, resulting in cancellation of the distortion and the signal illustrated in FIG. 4D, with no significant out of band power. In some embodiments, the signal at the output of DPD 202 is similar to that illustrated in FIG. 4B.

As illustrated in FIG. 4D, the duplexer bandwidth is slightly greater than the bandwidth of the data spectrum. Embodiments of the present invention utilize the filtering properties of the duplexer 208 to assist in removing some of the out of band power from the spectrum. Because of the use of the duplexer, it is not necessary to correct across the entire bandwidth (e.g., FB BW), but only a portion of the bandwidth with the duplexer providing a filtering function.

Figure 5A:
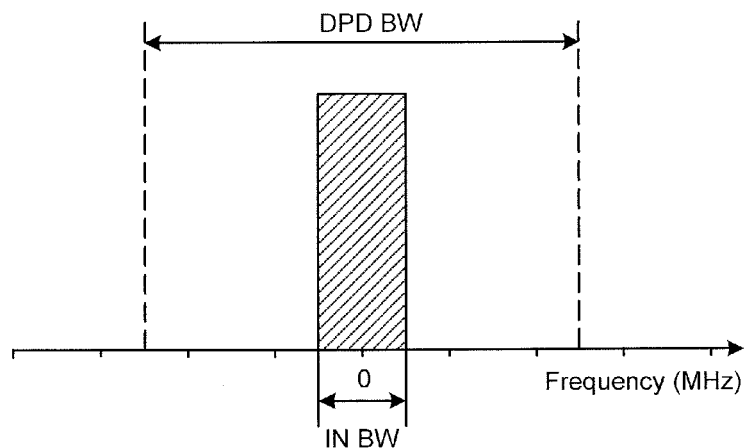
FIGS. 5A-5D are graphs showing the DPD bandwidth characteristics according to an embodiment of the present invention.
Figure 5B:
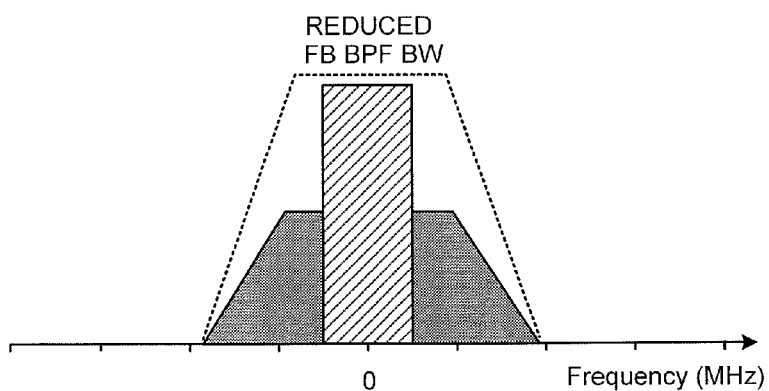

FIGS. 5A-5D are graphs showing the DPD bandwidth characteristics according embodiments of the present invention. As explained above in relation to FIG. 2, the DPD bandwidth is associated with the FB BPF bandwidth, which is less than the bandwidth required by conventional systems. FIG. 5A shows the DPD input signal. FIG. 5B shows the bandwidth of the feedback signal after the FB BPF 204. As illustrated in FIG. 5B, the bandwidth of the feedback signal after the FB BPF 204 is reduced in comparison to the DPD bandwidth. Thus, referring to FIG. 2, RF feedback band pass filter (RF FB BPF) 204 has a bandwidth as illustrated in FIG. 5B. This bandwidth is reduced in comparison to the DPD bandwidth.

Figure 5C:
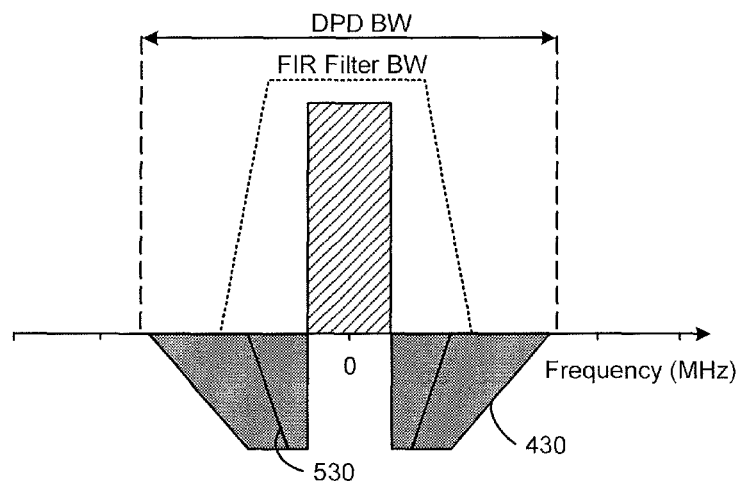

FIG. 5C shows the DPD output signal with predistortion components (based on the feedback signal) along with the narrower FIR digital filter bandpass characteristic, compared to that for a conventional system. The signal with predistortion components has a bandwidth of much less than the DPD bandwidth. As illustrated in FIG. 5C, the predistortion component 430 (see FIG. 4C) is greater than the predistortion component 530. This results from the filtering properties provided by RF FB BPF 204. It should be noted that the bandwidth associated with the predistortion component 530 is much narrower than the DBD BW.

Figure 5D:
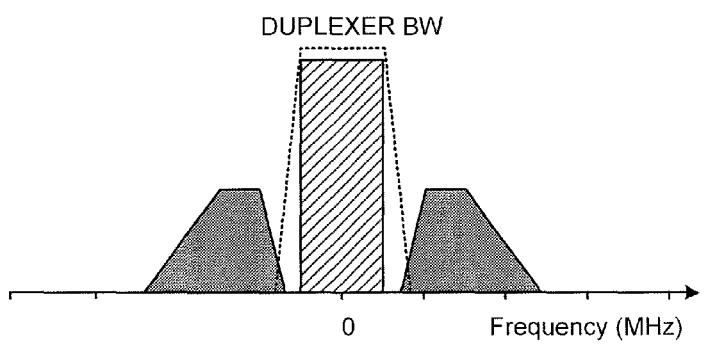

FIG. 5D shows the PA/duplexer output signal. In contrast with FIG. 4D, the Duplexer has a significant role in reducing output distortion well outside the bandwidth of the input signal. Close to the respective band edges of the desired signal, the DPD provides a substantial amount of distortion reduction. Thus, using the filtering properties of the duplexer enables compensation over a smaller range than otherwise available. Close to the carrier, the out of band power (outside the data spectrum) is substantially zero as a result of the digital predistortion techniques used herein. Although some out of band power is present, the majority of the power is outside the bandwidth of the duplexer, resulting in the majority of the power being filtered by the duplexer.

Figure 6:
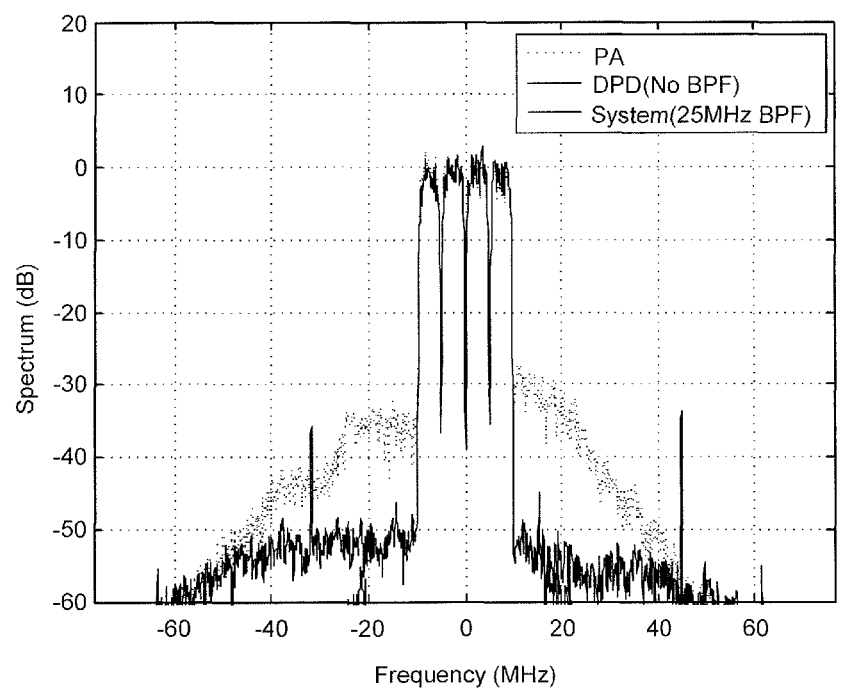
FIG. 6 is a plot showing spectral output response for a conventional system employing DPD.

FIG. 6 is a plot showing spectral output response for a conventional system employing DPD. The results in FIG. 6 are for a conventional PA system without any FB BPF. The results are for a 4 carrier WCDMA input signal (with a total bandwidth of 20 MHz) and 60 W average output power. The bandwidth of the distortion is ~100 MHz (i.e., 5 times the signal bandwidth). DPD reduces distortion more than 20 dB.

Figure 7A:
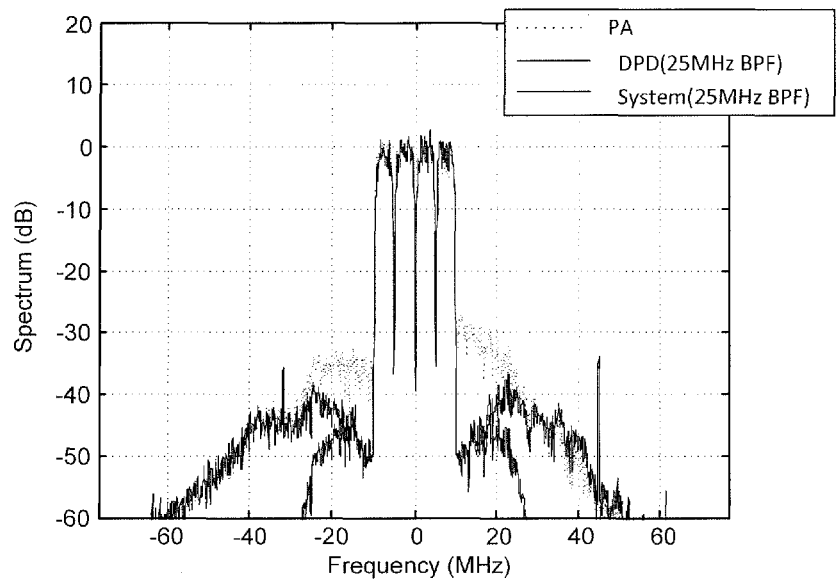
FIGS. 7A-7C are plots showing spectral output response for systems according to various embodiments of the present invention.
Figure 7B:
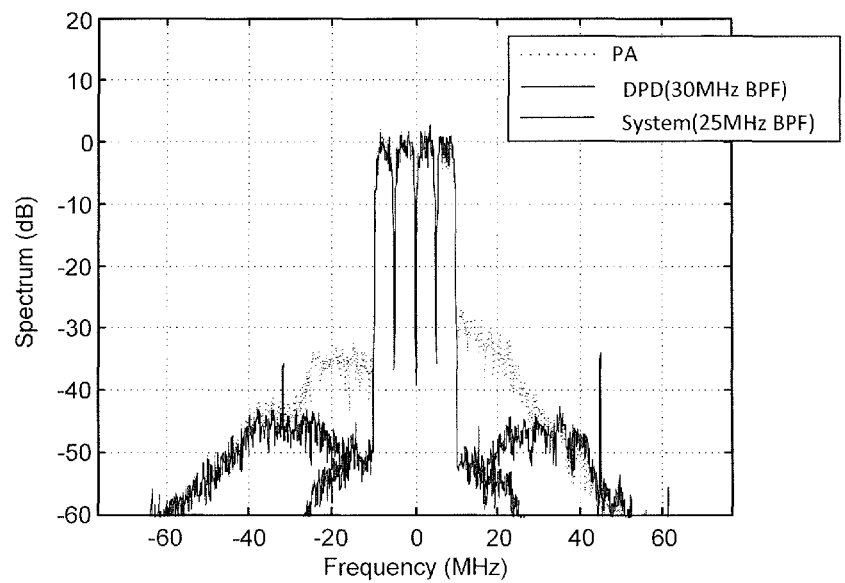
Figure 7C:
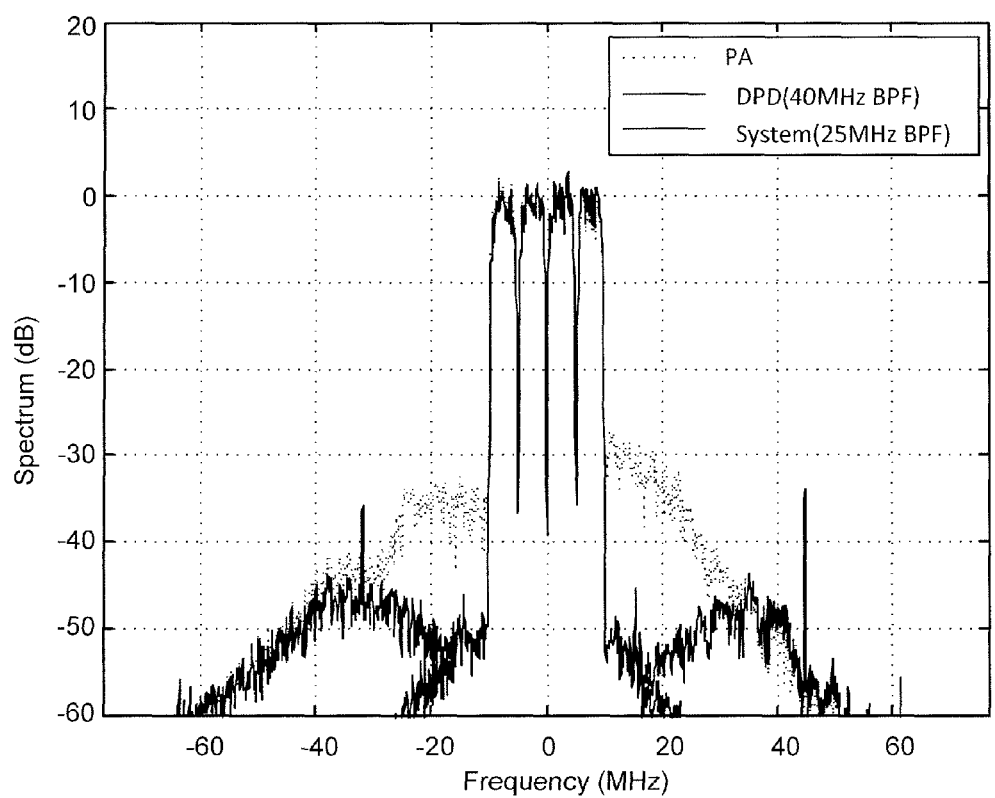

FIGS. 7A-7C are plots showing spectral output response for systems according to various embodiments of the present invention. The spectrum shown in FIGS. 7A-7C illustrate DPD performance based on various values of FB BPF bandwidth (FIR filter 203) (25 MHz, 30 MHz and 40 MHz respectively). With 25 MHz FB BPF bandwidth, the spectrum associated with DPD performance includes noise at a predetermined level. Systems using FB BPF bandwidths of 30 MHz and 40 MHz provide results for DPD performance that are comparable to the DPD performance for conventional systems, while utilizing an ADC 210 having a much lower sampling rate than the feedback ADC employed in a conventional system, which may be >100 MHz. Additionally, embodiments of the present invention utilize a filter 203 that is characterized by much lower bandwidth than a conventional filter in a conventional system which has a typical value of bandwidth greater than five times the signal bandwidth. The system bandwidth (i.e., 25 MHz) refers to the feedback loop and the bandwidth of RF FB BFP 204 in FIG. 2 or IF FB BPF 301 in FIG. 3.

Table 1 is a table showing Adjacent Channel Leakage Power Ratio (ACLR) performance for embodiments of the present invention, whose values are taken from results of FIG. 6 and FIGS. 7A-7C. Table 1 is a table that shows in various rows the ACLR performance of: PA system without DPD, PA with conventional DPD approach, PA with DPD with 25 MHz FB BPF according to the present invention, PA with DPD with 30 MHz FB BPF according to the present invention and PA with DPD with 40 MHz FB BPF according to the present invention. Based on the data shown in Table 1, systems utilizing a FB BPF with 30 MHz minimum bandwidth are able to achieve performance similar to the conventional PA with DPD. Therefore, some embodiments of the present invention utilize a 30 MHz feedback path bandwidth, meaning that a feedback ADC with a sampling rate of only 60 Msps can be employed. This contrasts with conventional DPD systems that require a feedback ADC with 200 Msps or greater sampling rate for similar performance.

In some embodiments, a 60 Msps feedback ADC is used for a 20 MHz instantaneous input signal bandwidth and a Duplexer is used with 25 MHz bandwidth. In some embodiments, a Duplexer is used that has a bandwidth slightly larger than the instantaneous or operational input signal bandwidth. In some embodiments, the value of feedback bandwidth is set at a value approximately 20% greater than the instantaneous or operational input signal bandwidth. In some embodiments, a system which supports a 60 MHz instantaneous or operational input signal bandwidth has its value of feedback bandwidth set to 72 MHz, such as would result from employing a feedback ADC with a 144 Msps sampling rate. Thus, embodiments of the present invention provide benefits (including reduced cost and complexity) not available using a conventional DPD system employing a feedback ADC with a 250 Msps sampling rate, which is a popular choice for many conventional DPD systems.

TABLE 1

| SYSTEM DESCRIPTION | ACLR (dBc) @ +5 MHz(+10 MHz) | ACLR (dBc) @ −5 MHz(−10 MHz) |
| --- | --- | --- |
| PA without DPD | −37.1(−38.8) | −28.2(−30.37) |
| Conventional DPD/ System(25 MHz) | −51.64(−51.83)/−52.29(−53.21) | −50.38(−51.14)/−50.84(−52.57) |
| DPD(25 MHz)/System(25 MHz) | −47.89(−45.6)/−48.72(−47.2) | −46.8(−45.46)/−47.46(−47.01) |
| DPD(30 MHz)/System(25 MHz) | −50.85(−50.2)/−51.54(−51.75) | −50.0(−50.84)/−50.49(−52.23) |
| DPD(40 MHz)/System(25 MHz) | −51.35(−51.45)/−51.99(−52.88) | −50.33(−51.46)/−50.79(−52.85) |

As illustrated in Table 1, the power amplifier without DPD has an ACLR value of −37.1 dBc and −28.2 dBc at +5 MHZ and −5 MHz, respectively. Using a conventional system, values of −51.64 dBc, etc. and −50.38 dBc, etc. are achieved. Utilizing embodiments of the present invention, as shown on the last three lines, values of −47.89 dBc, −50.85 dBc, and −51.35 dBc, respectively, are achieved. Thus, although performance is slightly degraded for the 25 MHz system of the present invention, performance improves for the 30 MHz system and is substantially equivalent for the 40 MHz system. Thus, embodiments of the present invention can utilize systems operating over a much narrower bandwidth (i.e., 40 MHz) than conventional DPD systems (i.e., 100 MHZ).

Figure 1:
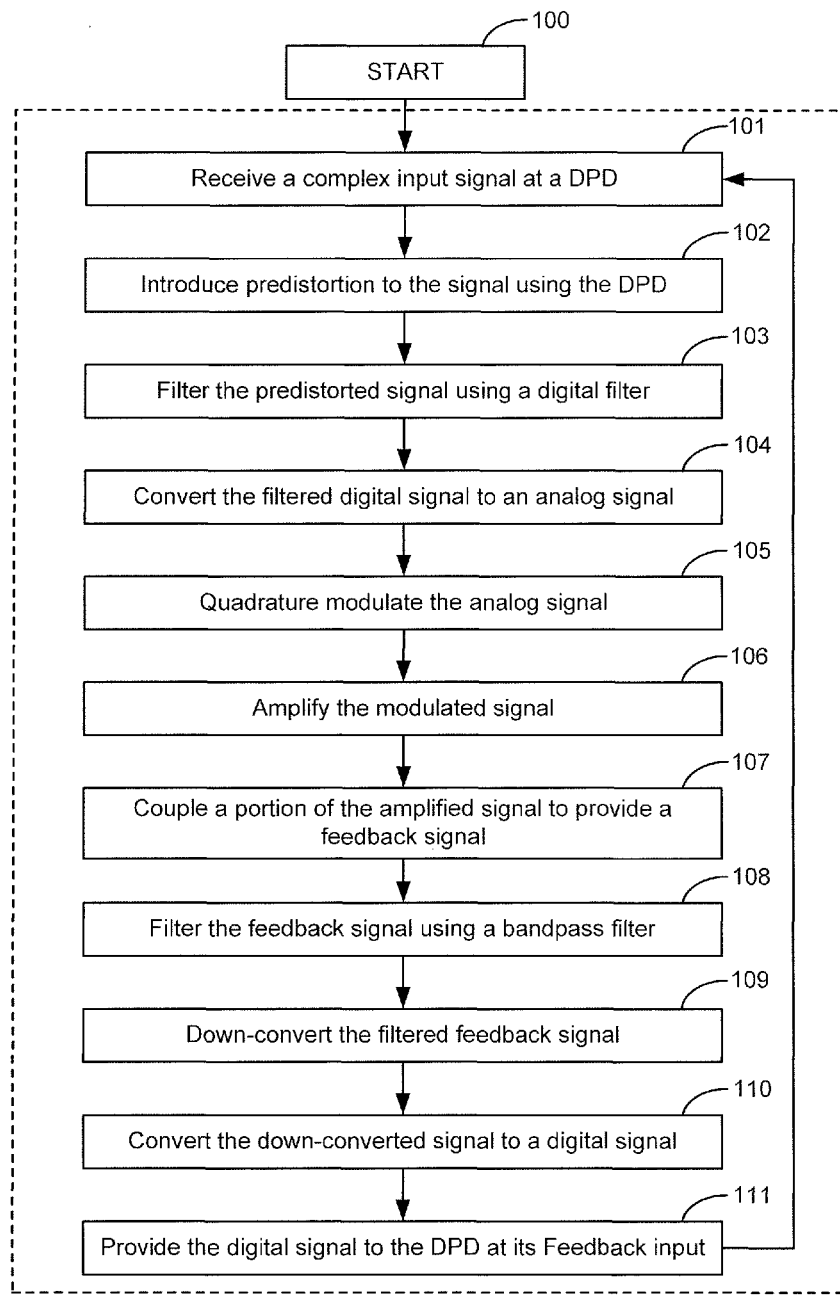
FIG. 1 is a simplified flowchart illustrating a method of increasing DPD linearization bandwidth according to an embodiment of the present invention.

FIG. 1 is a simplified flowchart illustrating a method of increasing DPD linearization bandwidth according to embodiments of the present invention. The method 100 includes receiving a complex input signal at a DPD (101) and introducing predistortion to the signal using the DPD (102). The method also includes filtering the predistorted signal using a digital filter (103) and converting the filtered signal to an analog signal (104). Filtering the predistorted signal can be performed over a filter bandwidth less than the bandwidth of the DPD, for example, over a filter bandwidth between 30 MHz and 50 MHz.

The method further includes quadrature modulating the analog signal (105), amplifying the modulated signal (106), coupling a portion of the amplified signal to provide a feedback signal (107), and filtering the feedback signal using a band-pass filter (108). Filtering the feedback signal using the band-pass filter can be performed over a band-pass bandwidth less than the bandwidth of the DPD, for example, the band-pass bandwidth can be between 30 MHz and 50 MHz.

Additionally, the method includes downconverting the filtered feedback signal (109), converting the downconverted signal to a digital signal (110), and providing the digital signal to the DPD at its feedback input (111). Converting the downconverted signal can be performed at a sampling rate less than twice the bandwidth of the DPD, for example, at a sampling rate is between 60 Msps and 100 Msps.

It should be appreciated that the specific steps illustrated in FIG. 1 provide a particular method of increasing DPD linearization bandwidth according to some embodiments. Other sequences of steps may also be performed according to alternative embodiments. For example, alternative embodiments of the present invention may perform the steps outlined above in a different order. Moreover, the individual steps illustrated in FIG. 1 may include multiple sub-steps that may be performed in various sequences as appropriate to the individual step. Furthermore, additional steps may be added or removed depending on the particular applications. One of ordinary skill in the art would recognize many variations, modifications, and alternatives.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A wideband communications system including:
   a digital predistorter (DPD) operable to receive an input signal, wherein the DPD is characterized by a first bandwidth;
   a filter characterized by a second bandwidth coupled to the output of the DPD;
   a digital-to-analog converter coupled to the output of the filter;
   a modulator coupled to the output of the digital-to-analog converter;
   a power amplifier coupled to the output of the modulator;
   a band-pass filter characterized by a third bandwidth coupled to the output of the power amplifier;
   a down-converter coupled to the output of the band-pass filter; and
   an analog-to-digital converter (ADC) coupled to the output of the down-converter, wherein the ADC is characterized by a sampling rate value less than one-third a value of the first bandwidth.

2. The wideband communications system of claim 1 wherein the third bandwidth is less than the first bandwidth.

3. The wideband communications system of claim 2 wherein the third bandwidth is equal to the second bandwidth.

4. The wideband communications system of claim 1 wherein the band-pass filter comprises a low power narrowband band-pass filter.

5. The wideband communications system of claim 1 wherein the filter comprises a narrowband digital filter.

6. The wideband communications system of claim 1 wherein the band-pass filter comprises a radio frequency (RF) filter.

7. The wideband communications system of claim 1 wherein the band-pass filter comprises an analog lower power narrowband intermediate frequency (IF) filter.

8. A communications system comprising:
   a digital predistorter (DPD) operable to receive an input signal, wherein the input signal is characterized by a bandwidth of 20 MHz and the DPD is characterized by a bandwidth of greater than 100 MHz;
   a digital filter coupled to the output of the DPD, wherein the digital filter is characterized by a bandwidth between 30 MHz and 50 MHz;
   a digital-to-analog converter coupled to the output of the digital filter;
   a modulator coupled to the output of the digital-to-analog converter;
   a power amplifier coupled to the output of the modulator;

a radio frequency (RF) band-pass filter coupled to the output of the power amplifier and characterized by a bandwidth less than 100 MHz; and an analog-to-digital converter (ADC) coupled to the output of the RF band-pass filter, wherein the ADC is characterized by a sampling rate less than or equal to 100 Msps.

9. The communications system of claim 8 wherein the bandwidth of the RF band-pass filter is between 30 MHz and 50 MHz.

10. The communications system of claim 8 wherein the sampling rate is between 60 Msps and 100 Msps.

11. A communications system comprising:
a digital predistorter (DPD) operable to receive an input signal, wherein the input signal is characterized by a bandwidth of 20 MHz and the DPD is characterized by a bandwidth of greater than 100 MHz;
a digital filter coupled to the output of the DPD, wherein the digital filter is characterized by a bandwidth between 30 MHz and 50 MHz;
a digital-to-analog converter coupled to the output of the digital filter;
a modulator coupled to the output of the digital-to-analog converter;
a power amplifier coupled to the output of the modulator;
an intermediate frequency (IF) band-pass filter coupled to the output of the power amplifier and the output of a down-converter, wherein the IF band-pass filter is characterized by a bandwidth less than 100 MHz; and
an analog-to-digital converter (ADC) coupled to the output of the IF band-pass filter, wherein the ADC is characterized by a sampling rate less than or equal to 100 Msps.

12. The communications system of claim 11 wherein the bandwidth of the IF band-pass filter is between 30 MHz and 50 MHz.

13. The communications system of claim 11 wherein the sampling rate is between 60 Msps and 100 Msps.

14. A method of operating a communications system, the method comprising:
receiving a signal at a digital predistorter (DPD) having a DPD bandwidth;
introducing predistortion to the signal using the DPD;
filtering the predistorted signal using a digital filter having a filter bandwidth less than the DPD bandwidth;
converting the filtered signal to an analog signal;
modulating the analog signal;
amplifying the modulated signal;
coupling a portion of the amplified signal to provide a feedback signal;
filtering the feedback signal using a band-pass filter;
downconverting the filtered feedback signal;
converting the downconverted signal to a digital signal; and
providing the digital signal to the DPD.

15. The method of claim 14 wherein the filter bandwidth is between 30 MHz and 50 MHz.

16. The method of claim 15 wherein filtering the feedback signal using a band-pass filter is performed over a band-pass bandwidth less than the DPD bandwidth.

17. The method of claim 16 wherein the band-pass bandwidth is between 30 MHz and 50 MHz.

18. The method of claim 14 wherein converting the downconverted signal is performed at a sampling rate less than twice the DPD bandwidth.

19. The method of claim 18 wherein the sampling rate is between 60 Msps and 100 Msps.

20. A wideband communications system including:
a digital predistorter (DPD) operable to receive an input signal, wherein the DPD is characterized by a first bandwidth;
a filter characterized by a second bandwidth coupled to the output of the DPD;
a digital-to-analog converter coupled to the output of the filter;
a modulator coupled to the output of the digital-to-analog converter;
a power amplifier coupled to the output of the modulator;
a band-pass filter characterized by a third bandwidth coupled to the output of the power amplifier, wherein the third bandwidth is less than the first bandwidth and equal to the second bandwidth;
a down-converter coupled to the output of the band-pass filter; and
an analog-to-digital converter (ADC) coupled to the output of the down-converter, wherein the ADC is characterized by a sampling rate value less than a value of the first bandwidth.

21. The wideband communications system of claim 20 wherein the band-pass filter comprises a low power narrowband band-pass filter.

22. The wideband communications system of claim 20 wherein the filter comprises a narrowband digital filter.

23. The wideband communications system of claim 20 wherein the band-pass filter comprises a radio frequency (RF) filter.

24. The wideband communications system of claim 20 wherein the band-pass filter comprises an analog lower power narrowband intermediate frequency (IF) filter.

* * * * *